US006084797A

United States Patent [19]

Maloberti et al.

[11] Patent Number: 6,084,797

[45] Date of Patent: Jul. 4, 2000

[54] METHOD FOR READING A MULTIPLE-LEVEL MEMORY CELL

[75] Inventors: Franco Maloberti, Torre D'Isola; Andrea Oneto, Milan; Guido Torelli, Sant'Alessio Con Vialone, all of Italy

[73] Assignee: STMicroelectronics S.r.l., Agrate Brianza, Italy

[21] Appl. No.: 09/276,214

[22] Filed: Mar. 25, 1999

[51] Int. Cl.[7] .................................................... G11C 16/04

[52] U.S. Cl. ................................ 365/185.03; 365/185.2; 365/185.22; 365/189.01; 365/189.07

[58] Field of Search ........................ 365/189.01, 189.07, 365/185.01, 185.03, 185.2, 185.22

[56] References Cited

U.S. PATENT DOCUMENTS

| | | | |
|---|---|---|---|
| 5,043,940 | 8/1991 | Harari | 365/168 |
| 5,095,344 | 3/1992 | Harari | 357/23.5 |
| 5,172,338 | 12/1992 | Mehrotra et al. | 365/185 |
| 5,729,490 | 3/1998 | Calligaro et al. | 365/185.03 |
| 5,757,719 | 5/1998 | Calligaro et al. | 365/235 |
| 5,761,110 | 6/1998 | Irrinki et al. | 365/100 |
| 5,808,932 | 9/1998 | Irrinki et al. | 365/150 |
| 5,867,423 | 2/1999 | Kapoor et al. | 365/168 |
| 5,982,659 | 11/1999 | Irrinki et al. | 365/168 |

FOREIGN PATENT DOCUMENTS

| | | | |
|---|---|---|---|
| 0 661 711 A1 | 12/1994 | European Pat. Off. | G11C 11/56 |
| WO 90/12400 | 10/1990 | WIPO | G11C 7/00 |

*Primary Examiner*—Viet Q. Nguyen
*Attorney, Agent, or Firm*—Theodore E. Galanthay; Allen, Dyer, Doppelt, Milbrath & Gilchrist, P.A.

[57] ABSTRACT

A multiple-level memory cell is capable of taking on a plurality of states, with each state being represented by a different value of a physical quantity and being associated with a corresponding logic value. A method for reading the memory cell includes the step of setting an actual physical quantity to a value correlated with the value of the physical quantity corresponding to the state of the memory cell. This step is repeated until the logic value corresponding to the state of the memory cell is determined. A cycle includes the step of setting a component of the logic value to a value which is a function of a range in which the actual physical quantity lies, as determined by comparing the actual physical quantity with at least one reference physical quantity having a predetermined value lying between a minimum value and a maximum value for the actual physical quantity. The cycle further includes setting the actual physical quantity for a possible next cycle to a relative value of the actual physical quantity with respect to the range in which it lies.

43 Claims, 4 Drawing Sheets

METHOD FOR READING A MULTIPLE-LEVEL MEMORY CELL

FIELD OF THE INVENTION

The present invention relates to integrated circuits, and, more particularly, to a memory device.

BACKGROUND OF THE INVENTION

A memory which can store data in a transitory or permanent way generally includes of a set of cells. Each memory cell can be programmed in such a way as to take on a plurality of states represented by different values of a physical quantity, and is typically an electrical quantity. Each state has associated with it a corresponding logic value. In particular, a multiple-level memory cell can take on three or more different states or levels. Typically, there are memory cells with $m=2^n$ levels, where $n \geqq 2$. Each memory cell allows a whole number, $n=\log_2 m$, of data bits to be stored.

Reading the logic value stored in a memory cell is generally carried out by comparing the electrical quantity, which defines the state of the memory cell, with the same electrical quantity of suitably programmed reference cells. The memory cell is typically non-volatile, i.e., capable of retaining the stored information even in the absence of an electrical power supply.

In a reading method of the parallel type, the state electrical quantity of the memory cell is compared simultaneously with $m-1$ reference electrical quantities, each of which has a value lying between two adjacent values which can be programmed into the memory cell. This method enables the logic value stored in the memory cell to be read in a single comparison operation. A disadvantage of this method is the fact that $m-1$ separate comparator circuits are required to compare the state electrical quantity of the memory cell with the same electrical quantity of the $m-1$ reference cells. This results in considerable power consumption and an excessive occupation of space in a chip of semiconductor material in which the memory is formed. Moreover, the connections between the memory cell and the comparator circuits for the transfer of the state electrical quantities are subject to noise known as "kick-back". This disadvantage makes it necessary to have circuitry dedicated to the elimination of the noise, which in turn results in additional occupation of the area of the chip and a general slowing of the reading operation.

In a reading method of the serial type, the state electrical quantity of the memory cell is compared on successive occasions with a single reference electrical quantity whose value is varied in a predetermined way. In particular, in a method of the sequential type, the comparison electrical quantity initially has a value lying, for example, between the first and the second values which can be programmed into the memory cell, then a value lying between the second and third values which can be programmed, and so on. This reading method is interrupted as soon as the comparison electrical quantity exceeds the value of the state electrical quantity of the memory cell or when it as reached the value lying between the next to the last and the last programmable values. This method requires a number of comparison operations varying from 1 to $m-1$, and provides a mean of $m/2$.

With a different serial method of the dichotomous type; that is dividing into two parts, the comparison electrical quantity is initially set to a mean value between the minimum and the maximum values which can be programmed into the memory cell. By comparing this electrical quantity with the state quantity of the memory cell, it is possible to determine whether the state electrical quantity falls in a first range delimited by the minimum value and the comparison value, or in a second range delimited by the comparison value and the maximum value. A similar procedure is then carried out on this range, and so on, until the value of the state quantity of the memory cell is determined exactly. This reading method requires a number of comparison operations equal to $\log_2 m$.

The serial reading methods described above require only a single comparator circuit. The comparison operations, however, are rather complicated and therefore require dedicated circuitry which results in a greater occupation of the area of the chip. Moreover, these reading methods require a number of comparison operations which have to be carried out in succession, since it is necessary to await the result of a preceding comparison operation before selecting the comparison electrical quantity to be used for the next operation. This results in a considerable slowing of the reading operation, which may be unacceptable in various applications.

There is also a known reading method of a mixed serial-parallel type, in which the state electrical quantity of the memory cell is compared simultaneously with two or more reference electrical quantities having a value lying between the minimum value and the maximum value which can be programmed into the memory cell. The result of these comparisons can be used to determine the range defined by these electrical quantities to which the state quantity of the memory cell belongs.

This reading method then proceeds in a similar way up to the exact determination of the value of the state quantity of the memory cell. If k denotes the number of ranges defined by the comparison electrical quantities, this reading method requires a number of comparison operations equal to $\log_2 m/\log_2 k$. The mixed type reading method provides a compromise between the two reading methods, parallel and divided into two parts, as described above, since it requires a smaller number of comparator circuits $(k-1)$ and enables the memory cell to be read with a limited number of comparison operations. However, the reading operation is rather complicated and too slow for many applications.

All the known reading methods require, in all cases, the presence of $m-1$ reference cells. Although in the reading methods of the serial and mixed type, not all the reference electrical quantities are used in every reading operation. This results in a corresponding increase in power consumption and an increase in the occupation of space in the chip. This also makes it necessary to program a large number of reference cells in a highly accurate way to ensure a high precision of the comparison operations, and consequently, to permit the use of a large number of different values for the state electrical quantity within a given range.

SUMMARY OF THE INVENTION

An object of the present invention is to overcome the above mentioned disadvantages when reading a multiple-level memory cell. A multiple-level memory cell is capable of taking on a plurality of states, with each state being represented by a different value of a physical quantity and each state being associated with a corresponding logic value. The method for reading a multiple-level memory cell includes the steps of setting an actual physical quantity to a value correlated with the value of the physical quantity corresponding to the state of the memory cell, and repeating a cycle until a complete determination of the logic value corresponding to the state of the memory cell is determined.

The cycle includes the steps of setting a component of the logic value to a value which is a function of a range in which the actual physical quantity lies, which is determined by comparing the actual physical quantity with at least one reference physical quantity having a predetermined value lying between a minimum value and a maximum value for the actual physical quantity. The actual physical quantity for a possible next cycle is set to a relative value of the actual physical quantity with respect to the range in which it lies.

A corresponding device is also provided for reading a multiple-level memory cell, together with a memory structure including such a device. The memory structure preferably includes at least one multiple-level memory cell capable of taking on a plurality of states as defined above. The memory device preferably includes a selection circuit for selecting the at least one memory cell and providing at an output the physical quantity corresponding to a state of the selected memory cell, and at least one device for reading the memory cell.

The device preferably includes a reference circuit for generating a plurality of reference electrical quantities, and a sensing circuit for comparing a physical quantity corresponding to the state of the memory cell with the reference electrical quantities. The sensing circuit includes a plurality of units cascade connected, each unit having an input receiving an actual physical quantity from a preceding unit.

The plurality of units preferably includes a first unit having an input receiving an actual physical quantity correlated with the physical quantity corresponding to the state of the memory cell, and at least one reference electrical quantity having a predetermined value lying between a minimum value and a maximum value of the actual physical quantity. The first unit has an output providing a component of the logic value which is a function of a range within which the actual physical quantity lies, determined by comparing the actual physical quantity with at least one reference electrical quantity, and an actual physical quantity for a possible next unit equal to a relative value of the actual physical quantity with respect to the range within which it lies.

BRIEF DESCRIPTION OF THE DRAWINGS

Further characteristics and the advantages of the method for reading a multiple-level memory cell according to the present invention will be understood from the following description of a preferred embodiment of the invention, provided for guidance and without restriction, with reference to the attached figures, in which.

DETAILED DESCRIPTION OF THE PREFERRED EMBODIMENTS

Figure 1:
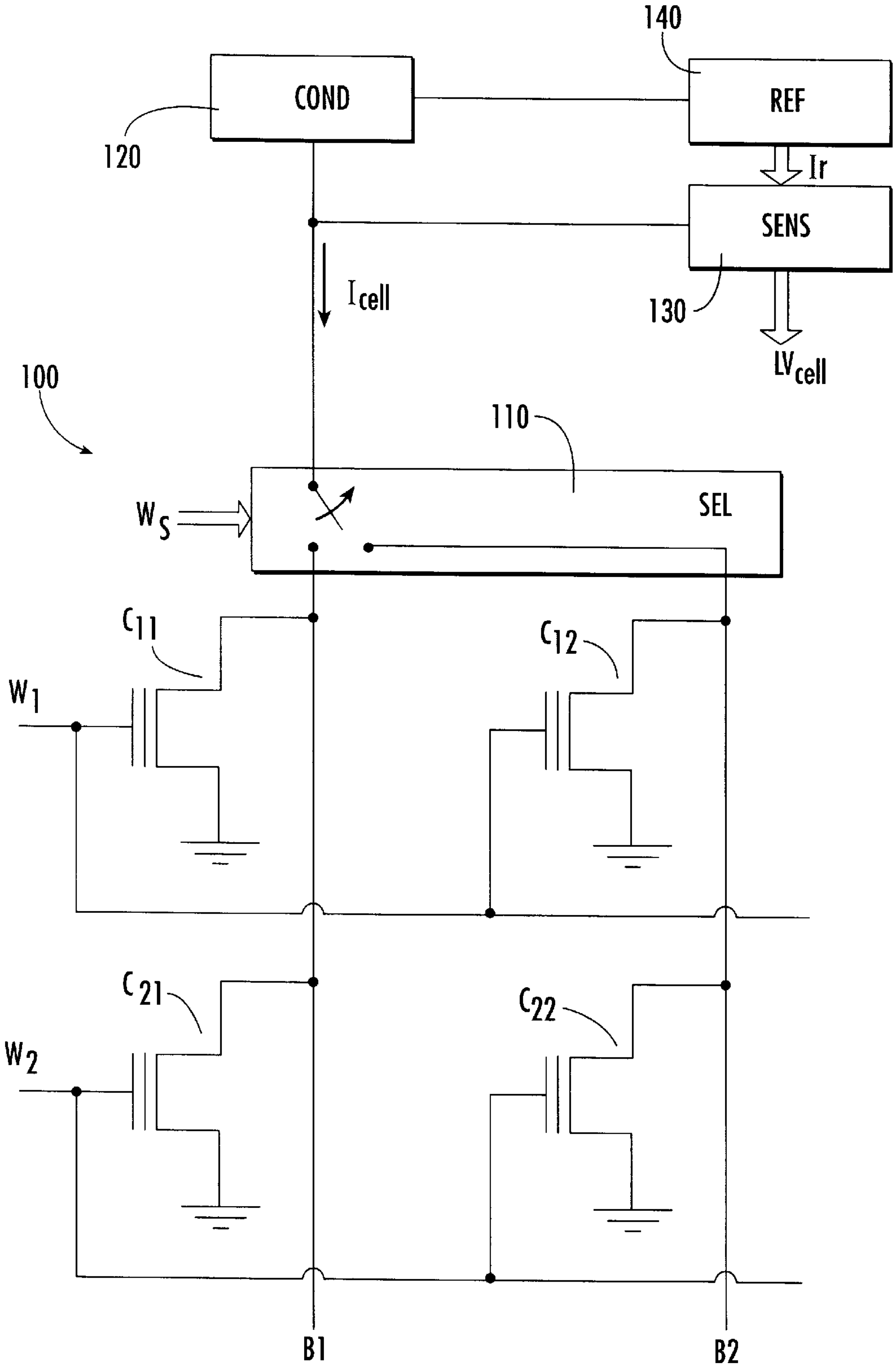
FIG. 1 shows a memory structure according to the present invention.

With reference to FIG. 1 in particular, a memory structure 100 includes a multiple-level matrix of cells. Four cells $C_{11}$, $C_{12}$, $C_{21}$ and $C_{22}$ are shown in the example figure. The memory 100 is, for example, an EEPROM ($E^2$PROM) memory of the flash type, in which each cell $C_{11}$–$C_{22}$ includes a field-effect MOS transistor of the floating-gate type. Each cell $C_{11}$–$C_{22}$ can be programmed at a plurality of levels represented by corresponding values of a threshold voltage of the MOS transistor, which depends on the charge accumulated in the floating gate.

The transistors of each cell $C_{11}$–$C_{22}$ have their source terminals connected to a common line for each sector (source line), which is generally set to a reference voltage (ground) during the reading operation. The gate terminals of the transistors of each row $C_{11}$, $C_{12}$ and $C_{21}$, $C_{22}$ are connected to the same word lines $W_1$ and $W_2$ respectively. The drain terminals of the transistors of each column $C_{11}$, $C_{21}$ and $C_{21}$, $C_{22}$ are connected to the same bit lines $B_1$ and $B_2$ respectively. The bit lines $B_1$ and $B_2$ are connected to separate input terminals of a selector circuit (SEL) 110. An output terminal of the selector circuit 110 connected to only one of the bit lines $B_1$ and $B_2$ according to the value taken by a selection command Ws. The output terminal of the selector circuit 110 is connected to a conditioning circuit (COND) 120.

In a quiescent state, the word lines $W_1$, $W_2$ are at a low potential, e.g., 0 V, so that the transistors of all the cells $C_{11}$–$C_{22}$ are turned off. To read a memory cell, cell C12 for example, the corresponding bit line $B_2$ is connected through the selector circuit 110 to the conditioning circuit 120 in such a way that the drain terminals of the corresponding transistors are brought to a suitable potential, e.g., 1 V, for the correct polarization of the memory cell $C_{12}$. This process requires a time interval (pre-charge time) that is not insignificant because of the considerable capacitive load connected to the bit line. During this pre-charge phase, the memory cell $C_{12}$ is selected by setting the corresponding word line $W_1$ to a high value.

In this situation, the capacity to supply current, i.e., conductance, of the transistor of the selected cell $C_{12}$ is proportional to the difference between the voltage on its gate terminal, i.e., on the word line $W_1$, and its threshold voltage. The conductance is zero if the threshold voltage is greater than the voltage on the gate terminal. Thus, the current Icell supplied by the selected cell $C_{12}$ corresponds to the logic value stored in it.

The cell current Icell is supplied to a first input terminal of a comparison circuit (SENS) 130, which receives at further input terminals various reference currents. These reference currents are indicated in their totality by Ir, which are generated by a suitable circuit (REF) 140. The comparison circuit 130 is connected to the conditioning circuit 120 and, in particular, to transistors other than those used for pre-charging the selected cell. The comparison circuit 130 compares the cell current Icell with the reference currents Ir and produces at its output terminals the logic value LVcell corresponding to the data element stored in the selected cell. Similar considerations are applicable to other memory cells, with corresponding accessory circuits that are not shown. These other memory cells may possibly be read in parallel to produce a memory word at the output. For example, in the case of memory cells with 16 levels, i.e., with $\log_2 16=4$ bits, 8 cells will be read simultaneously if the memory word consists of 32 bits.

Figure 2:
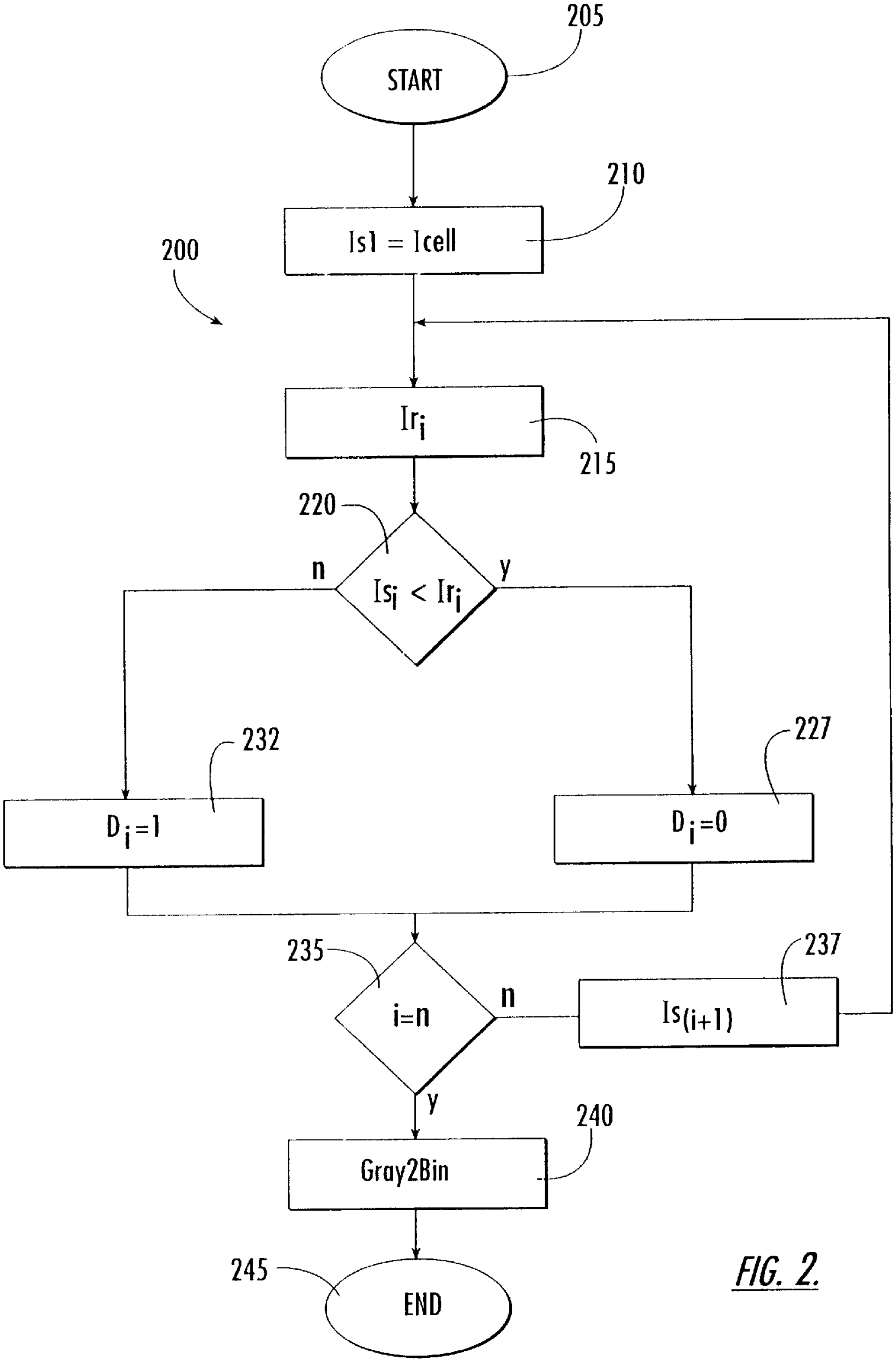
FIG. 2 is a block diagram of an example of a reading method according to the present invention.

However, the present invention is also suitable for application with memory cells of a different type. For example, the memory cells may include metal-nitride-oxide semiconductor or MNOS transistors, and in general, any multiple-level memory cell which can take on three or more states. These states are represented by different values of a physical quantity, and each state has an associated corresponding logic value. Similarly, the memory structure may have a linear or square arrangement, and may consist of a plurality of memory banks or a simple register. In general, a memory structure is provided which includes at least one multiple-level memory cell, a selection circuit means for selecting a memory cell and supplying at the output a physical quantity If we now consider FIG. 2, a method 200 for reading the selected memory cell is illustrated in the form of a flow chart. Assuming, for example, that the memory cell is capable of storing m=16 different logical values (from 0 to 15). In other words, $n=\log_2 16=4$ bits. The logical value 0 is associated, for example, with a zero cell current $Icell_0$. This makes it unnecessary to program the corresponding threshold voltage in a very precise way. It is sufficient for the threshold voltage to be greater than that applied to the gate terminal at the reading stage. The difference between the cell current associated with each logical value and the cell current associated with the immediately preceding logical value is fixed, at 8 μA for example. Therefore, the logical value 1 is associated with a cell current $Icell_1=8$ μA. The logical value 2 is associated with a cell current $Icell_2=16$ μA, and so on, up to the logical value 15, which is associated with a cell current $Icell_{15}=120$ μA.

Due to variations in the ambient conditions, the degradation with time of the charge stored in the floating gate and the phenomena of disturbances at both the programming and the reading stage, each logical value is associated with a range of cell currents around the value stated above. These ranges are very narrow, ±1 μA for example. The cell currents corresponding to different logical values are spaced sufficiently far apart from each other so that it is possible to discriminate between them without error at the reading stage. Similar considerations are applicable in the case in which the logical value 0 is associated with a non-zero cell current. The difference between the cell current associated with two adjacent logical values is not fixed. For example, with an upper value between the logical value 0 and the logical value 1.

The reading method 200 starts at box 205 and then moves to box 210 in which an initial actual current $Is_1$, used as described in detail below, is set to be equal to the cell current Icell. The method then repeats the cycle described below for $n=\log_2 m$ number of times. Every i-th cycle, where i=1 . . . n, starts at box 215 in which a reference current $Ir_i$ is considered. The actual current $Is_i$ lies between the values associated with a minimum logical value Min and a maximum logical value Max. The reference current $Ir_i$ has a value lying preferably halfway between the currents associated with the median logical values (Max+1)/2−1 and (Max+1)/2.

Next, in box 220, the actual current $Is_i$ is compared with the reference current $Ir_i$. If the actual current $Is_i$ is less than the reference current $Ir_i$, the method proceeds to box 227, in which a corresponding bit $D_i$ of the logical value stored in the cell is set to a first value, for example 0. If the actual current $Is_i$ is greater than the reference current $Ir_i$, the method proceeds to box 232, in which the corresponding bit $D_i$ of the logical value stored in the cell is set to a second value, for example 1. Due to the way in which the reference current $Ir_i$ is set, there can never be a situation of equality between the actual current $Is_i$ and the reference current $Ir_i$.

In both cases, the method continues to box 235, in which a check is made for the presence of the condition for output from the cycle, namely i=n. If the result is positive, the method proceeds to box 240 as described below. If the result is negative, the method goes to box 237, in which the actual current for the next cycle $Is_{(i+1)}$ is set. In particular, the actual current for the next cycle $Is_{(i+1)}$ is set to be equal to the actual current $Is_i$ (if $Is_i<Ir_i$), or equal to the value $2\cdot Ir_i-Is_i$ (if $Is_i>Ir_i$). Preferably, as described in detail below, the actual current for the next cycle $Is_{(i+1)}$ is determined automatically by the actual current $Is_i$ and by the reference current $Ir_i$ without the need for a decision and selection structure. The method then returns to box 215 to repeat the cycle described above.

During a first execution of the cycle defined by the boxes 215–237 (i=1), the actual current $Is_1$ lies between the values associated with the minimum logical value Min=0 and the maximum logical value Max=m−1. Therefore, the reference current $Ir_1$ is set to a value lying halfway between the currents associated with the logical values (Max+1)/2−1=m/2−1 and (Max+1)/2=m/2. In the example, the reference current $Ir_1$ is set to a value lying halfway between $Icell_7=56$ μA and $Icell_8=64$ μA, in other words, 60 μA.

The actual current $Is_2$ for the next cycle is determined in such a way that the cell currents $Icell_j$ (where j=0 . . . m/2−1) and $Icell_{(m-j-1)}$ (where m−j−1=m/2 . . . m−1) disposed symmetrically about the reference current $Ir_1$ produce the same actual current $Is_2$. For example, the cell current $Icell_4=32$ μA, corresponding to the logical value j=4, produces the actual current $Is_2=Is_1=Icell_4=32$ μA. Similarly, the cell current $Icell_{11}=88$ μA corresponding to the logical value m−j−1=16−4−1=11 produces the actual current $Is_2=2\cdot Ir_1-Is_1=2\cdot Ir_1-Icell_{11}=2\cdot 60-88=32$ μA. Consequently the actual current $Is_2$ will lie, in every case, between the values associated with the minimum logical value Min=0 and with the maximum logical value Max=m/2−1, so that the corresponding reference current $Ir_2$ is set to a value lying between the currents associated with the logical values (Max+1)/2−1=m/4−1 and (Max+1)/2=m/4, and so on, making the method extremely simple and effective.

It should be noted that the reference currents $Ir_i$ used in the various cycles have predetermined values which do not depend on the outcome of the preceding comparisons. For example, in the case considered above, $Ir_1=60$ μA, $Ir_2=28$ μA, $Ir_3=12$ μA and $Ir_4=4$ μA. The actual currents $Is_i$ and the bits $D_i$ for each logical value which can be stored in the cell in the example are represented in the following table:

| Value | $IS_1$ | $IS_2$ | $IS_3$ | $IS_4$ | $D_1$ | $D_2$ | $D_3$ | $D_4$ |
|---|---|---|---|---|---|---|---|---|
| 15 | 120 | 0 | 0 | 0 | 1 | 0 | 0 | 0 |
| 14 | 112 | 8 | 8 | 8 | 1 | 0 | 0 | 1 |
| 13 | 104 | 16 | 16 | 8 | 1 | 0 | 1 | 1 |
| 12 | 96 | 24 | 24 | 0 | 1 | 0 | 1 | 0 |
| 11 | 88 | 32 | 24 | 0 | 1 | 1 | 1 | 0 |
| 10 | 80 | 40 | 16 | 8 | 1 | 1 | 1 | 1 |
| 9 | 72 | 48 | 8 | 8 | 1 | 1 | 0 | 1 |
| 8 | 64 | 56 | 0 | 0 | 1 | 1 | 0 | 0 |
| 7 | 56 | 56 | 0 | 0 | 0 | 1 | 0 | 0 |
| 6 | 48 | 48 | 8 | 8 | 0 | 1 | 0 | 1 |
| 5 | 40 | 40 | 16 | 8 | 0 | 1 | 1 | 1 |
| 4 | 32 | 32 | 24 | 0 | 0 | 1 | 1 | 0 |
| 3 | 24 | 24 | 24 | 0 | 0 | 0 | 1 | 0 |
| 2 | 16 | 16 | 16 | 8 | 0 | 0 | 1 | 1 |
| 1 | 8 | 8 | 8 | 8 | 0 | 0 | 0 | 1 |
| 0 | 0 | 0 | 0 | 0 | 0 | 0 | 0 | 0 |

It is easy to check that the method described above generates a logical value represented in binary code of the Gray type in which two adjacent encoded values differ from each other by the value of one bit only. If we now consider box 240, the logical value in Gray code is converted into binary weighted code. Alternatively, the logical value in Gray code is converted into a different code, for example, ASCII or EBCDIC, or no conversion is carried out. The method then terminates at the end box 245.

Similar considerations are applicable in cases in which a memory cell having a different number of levels, possibly not equal to a power of 2, is read. The actual current for the first cycle is set to another value. The actual current is compared with two or more reference currents in each cycle. The reference currents are set to other values. The actual current for the next cycle is determined in a different way. For example, so that it equals the actual current, or the actual current minus the reference current, depending on the result of the comparison.

In general, the reading method according to the present invention provides the steps of setting an actual physical quantity to a value correlated with the value of the physical quantity corresponding to the state of the memory cell. The method further includes repeating, until the logical value corresponding to the state of the memory cell has been fully determined, a cycle including the step of setting a component of the logical value to a value which is a function of a range in which the actual physical quantity lies. This value is determined by comparing the actual physical quantity with at least one reference physical quantity having a predetermined value lying between a minimum value and a maximum value for the actual physical quantity. The cycle further includes the step of setting the actual physical quantity for a possible successive cycle to a relative value of the actual physical quantity with respect to the range in which it lies.

The method according to the present invention can be used to obtain a very high reading speed, which is slightly less than that of the known reading method of the parallel type. This is because the value of each reference electrical quantity is predetermined and does not depend on the outcome of the preceding comparisons. The actual electrical quantities are obtained in an extremely simple way, and the various components of the logical value can be found without waiting until the preceding components have been determined.

This method requires a smaller number of reference cells, $\log_2 m$ instead of m−1, and uses a correspondingly reduced number of comparison circuits. This results in a saving in terms of power consumption and of occupation of space in the chip. The method according to the present invention is particularly advantageous in the case of a memory cell having a large number of levels, e.g., at least eight or sixteen, although its use with a memory cell having any number of levels is not excluded.

An example of a device which can be used to apply the reading method described above is illustrated in FIG. 3. The elements previously shown in FIG. 1 are indicated with the same reference numbers or symbols. The reference circuit 140 includes n cells $R_i$, each of which generates the corresponding reference current $Ir_i$. Each reference cell $R_i$ consists of a floating-gate MOS transistor identical to those used for the memory cells, with the reference and memory cells formed in the same chip. This ensures an optimal reading accuracy, since it minimizes the differences between memory and reference cells caused by the manufacturing process and by variations in the operating and environmental conditions.

The transistors of each reference cell $R_i$ have their source terminals connected to a common line set to ground voltage during the reading operation, while the gate terminal is kept at a potential equal to that used to select the word lines $W_1$, $W_2$, as shown in FIG. 1, of the memory structure. The drain terminal of the transistor of each reference cell $R_i$ is connected to a terminal of a switch $SW_i$. The other terminal of which is connected to the conditioning circuit 120. Thus, in the reading stage, the reference cells $R_i$ and the selected memory cell are biased with substantially identical voltages. When the switches $SW_i$ are closed, each reference cell $R_i$ supplies a predetermined reference current $Ir_i$, which is a function of the threshold voltage of the corresponding MOS transistor.

The comparison circuit 130 includes n units $S_i$, each of which receives at a reference input terminal $INr_i$ the corresponding current $Ir_i$. These units are cascade connected in such a way that each unit $S_i$ receives at an input terminal $INs_i$ the actual current $Is_i$ supplied by an output terminal $OUTs_{(i-1)}$ of the preceding unit $S_{(i-1)}$. The first unit $S_1$ receives at the input terminal $INs_1$ the first actual current $Is_1$, which is equal to the cell current Icell, while the output terminal $OUTs_n$ of the last cell $S_n$ is not used.

Each unit $S_i$ produces at a digital output terminal $OUTd_i$ the corresponding bit $D_i$ in Gray code of the logical value stored in the cell. These bits are supplied to corresponding input terminals of a converter unit (GRAY2BIN) 310. The converter unit 310 converts the logical value at the input from Gray code to binary code, and if necessary, supplies at its output terminals the bits $b_0, b_1, \ldots, b_{n-1}$ representing the logical value LVcell.

Figure 3:
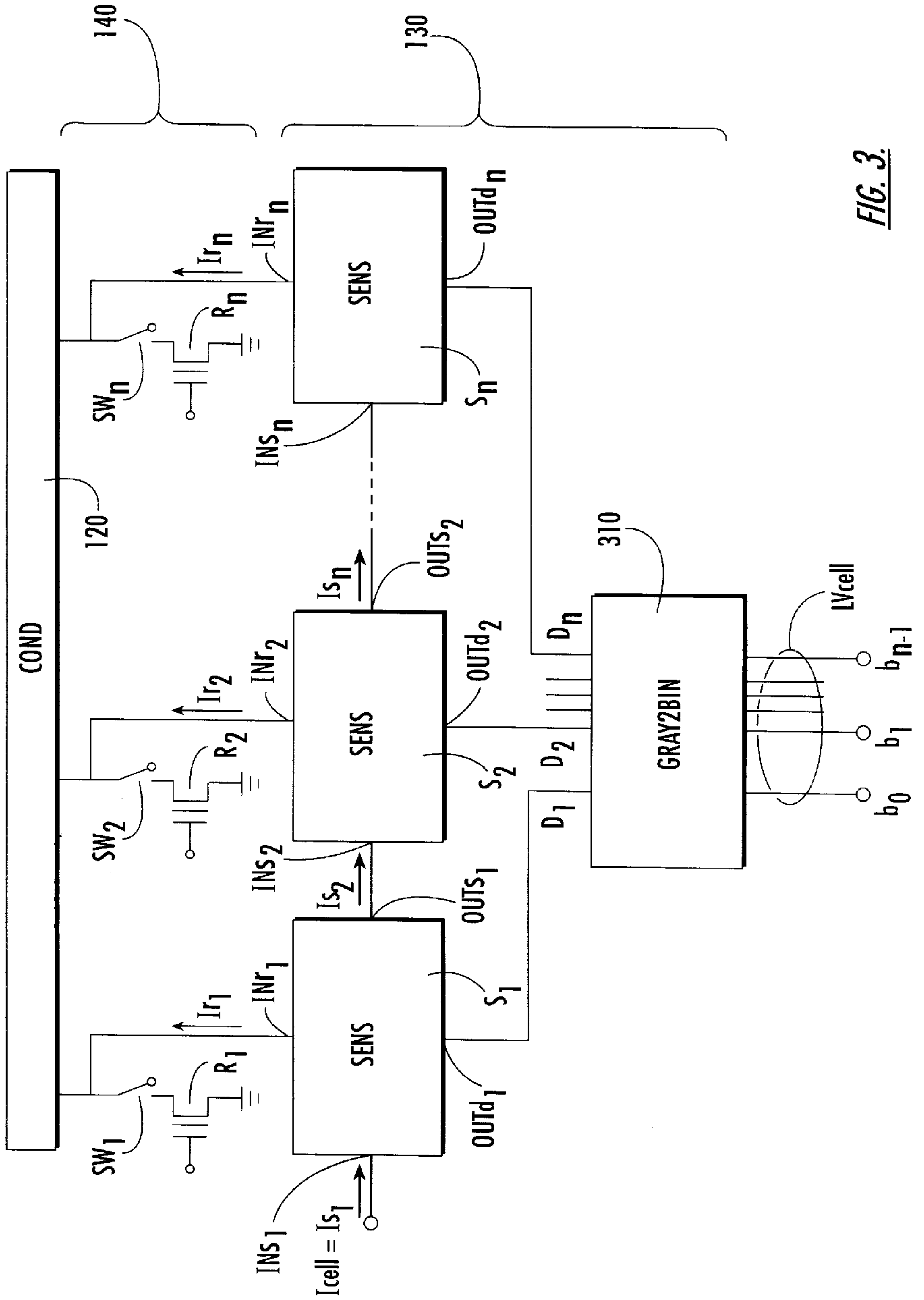
FIG. 3 is a schematic block diagram of a device for carrying out the reading method according to the present invention.
Figure 4:
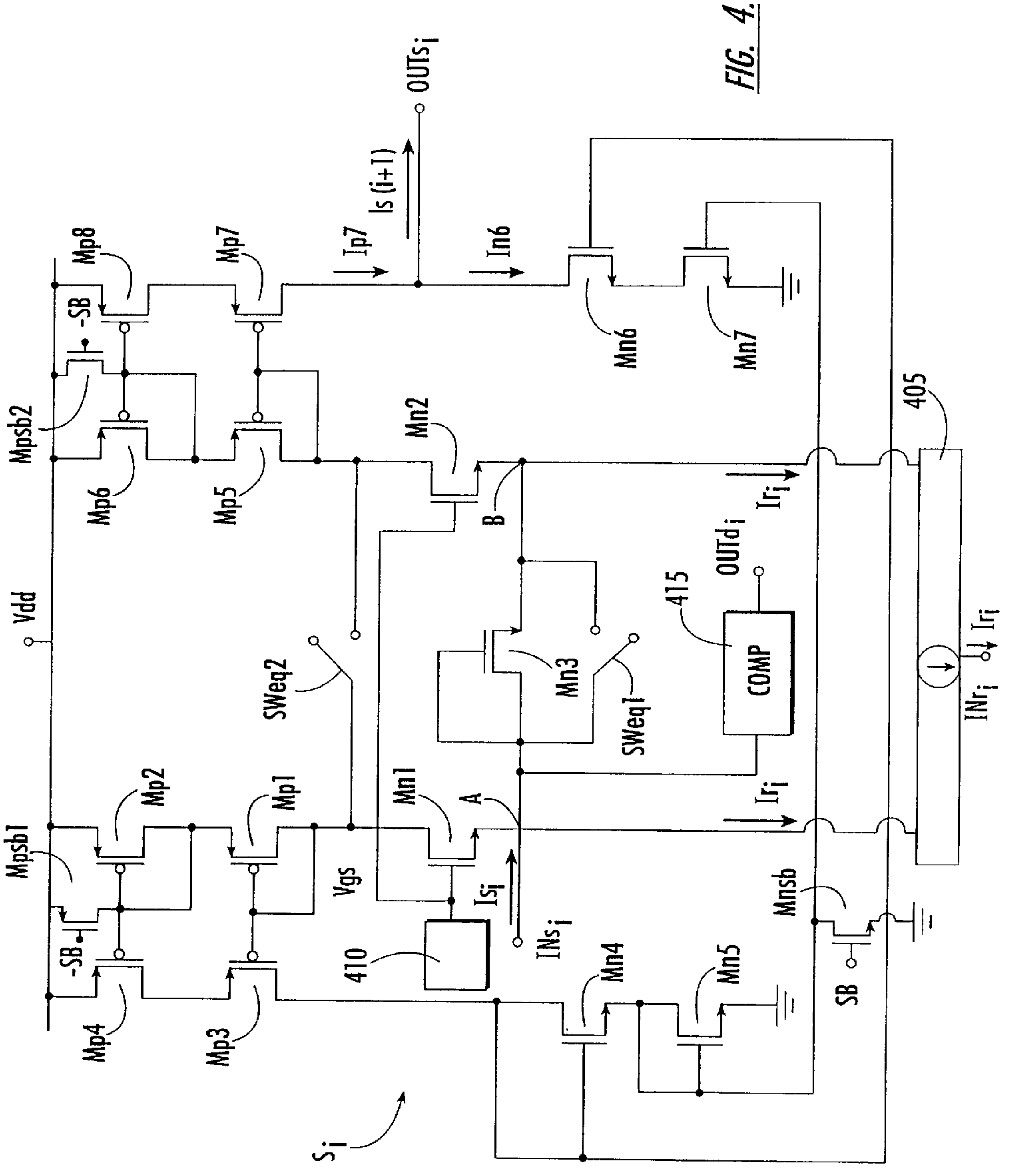
FIG. 4 is a circuit diagram of one unit of the reading device according to the present invention.

The circuit diagram of a preferred embodiment of a generic unit $S_i$ is shown in FIG. 4. The elements previously shown in FIG. 3 are indicated by the same reference numbers or symbols. The input terminal $INr_i$, to which the reference current $Ir_i$ is applied, is connected to an input terminal of a current generator unit 405. The unit 405 has two output terminals which supply, for example, by internal current mirror structures, the same reference current $Ir_i$. The first output terminal of the unit 405, junction A, is connected to the source terminal of an n-channel MOS transistor Mn1. The second output terminal of the unit 405, junction B, is connected to the source terminal of an n-channel MOS transistor Mn2. The gate terminal of the transistors Mn1 and Mn2 is connected to a unit 410, which generates a suitable voltage Vgs for the correct biasing of the transistors Mn1 and Mn2.

The source terminal of the transistor Mn1 is also connected to the input terminal $INs_i$, to which the actual current $Is_i$ is applied, and to a first terminal of a voltage comparator unit (COMP) 415, whose second terminal is connected to the digital output terminal $OUTd_i$. The output terminal $OUTd_i$ produces the corresponding bit $D_i$, in Gray code, of the logical value stored in the memory cell.

An n-channel MOS transistor Mn3 has its drain terminal and source terminal connected to junction A and junction B respectively. The transistor Mn3 is connected in diode configuration with the gate terminal short-circuited to the drain terminal. Alternatively, other equivalent circuits with unidirectional conduction may be used. Preferably, an equalizing switch SWeq1 formed by a MOS transistor or a pair of complementary MOS transistors or similar, is also connected between the drain terminal and the source terminal of the transistor Mn3. Similarly, an additional equalizing switch SWeq2 is preferably connected between the drain terminals of the transistors Mn1 and Mn2.

The unit $S_i$ also includes a current mirror with a cascade structure, formed by four p-channel MOS transistors Mp1, Mp2, Mp3 and Mp4. In particular, the transistors Mp1 and Mp3 and the transistors Mp2 and Mp4 have their gate terminals in common. The source terminals of the transistors Mp1 and Mp3 are connected to the drain terminals of the transistors Mp2 and Mp4 respectively. The gate terminals of the transistors Mp1 and Mp2 are short-circuited to their drain terminals. The source terminals of the transistors Mp2 and Mp4 are connected to the positive terminal of a power supply Vdd, whose negative terminal is connected to the ground terminal.

Preferably, the current mirror Mp1–Mp4 also includes a stand-by p-channel MOS transistor Mpsb1, whose source terminal and drain terminal are connected in short circuit to the source terminals and gate terminals of the transistors Mp2 and Mp4 respectively. The gate terminal of the transistor Mpsb1 is controlled, as described in detail below, by a suitable negated signal –SB.

An additional current mirror formed by four n-channel MOS transistors Mn4, Mn5, Mn6 and Mn7, including a stand-by n-channel MOS transistor Mnsb whose gate terminal is controlled by the signal SB, have a dual structure with respect to that described above. The transistors are cascade connected to the current mirror Mp1–Mp4. In particular, the drain terminal of the transistor Mn1 is connected to the drain terminal of the transistor Mp1, which forms the first branch of the current mirror Mp1–Mp4. The drain terminal of the transistor Mp3, which forms the second branch of the current mirror Mp1–Mp4, is connected to the drain terminal of the transistor Mn4, which forms the first branch of the current mirror Mn4–Mn7. The drain terminal of the transistor Mn6, which forms the second branch of the current mirror Mn4–Mn7, is connected to the output terminal OUTsi. The output terminal $OUTs_i$ supplies the actual current $Is_{(i+1)}$ for the next unit.

The unit $S_i$ includes a similar current mirror with a cascade structure formed by four p-channel MOS transistors Mp5, Mp6, Mp7 and Mp8, with a stand-by p-channel MOS transistor Mpsb2. The drain terminal of the transistor Mn2 is connected to the drain terminal of the transistor Mp5, which forms the first branch of the current mirror Mp5–Mp8, and the drain terminal of the transistor Mp7, which forms the second branch of the current mirror Mp5–Mp8, is connected to the output terminal $OUTs_i$.

The current mirrors with a cascade structure described above provide high accuracy for the mirror factor, i.e., the equality between the currents in their two branches. This ensures a very high overall accuracy of the reading device, which is particularly advantageous in the case of memory cells with a large number of levels. Alternatively, it is possible to use conventional current mirrors with only one transistor in each branch. High-swing current mirror structures with high output resistance is described, for example, in an article by P. J. Crawley and G. W. Roberts, titled "High-swing MOS current mirror with arbitrarily high output resistance", published in *Electronics Letters*, February 1992, v. 28, No. 4, pp. 361–363. The article discloses that a high mirror factor accuracy with a low supply voltage less than 5 V, for example, is required.

To explain the operation of the circuit described above, we shall consider a steady condition in which the equalizing switches SWeq1 and SWeq2 are open and in which the control signal SB is at a low level with the dual control signal –SB at a high level so that the stand-by transistors Mnsb and Mpsb1, Mpsb2 are turned off. In this situation, it is assumed that an actual current $Is_i$, which is lower than the reference current $Ir_i$, is applied to the input terminal $INs_i$. Since the transistor Mn3 connected in a diode configuration cannot conduct current from junction B to junction A, this transistor will be turned off.

The current ($Ir_i$–$Is_i$) required for the correct balance of the currents at junction A will be supplied by the transistor Mn1. This current is mirrored by the structures Mp1–Mp4 and Mn4–Mn7 so that a current $In6=Ir_i-Is_i$ will be present at the drain terminal of the transistor Mn6. The current which flows through the transistor Mn2, since the transistor Mn3 is turned off, is equal to the reference current $Ir_i$. This current is mirrored by the structure Mp5–Mp8 so that a current $Ip7=Ir_i$ will be present at the drain terminal of the transistor Mp7. The current supplied by the output terminal $OUTs_i$ will therefore be $Is_{(i+1)}=Ip7-In6=Ir_i-(Ir_i-Is_i)=Is_i$.

Let us now assume that an actual current $Is_i$, which is greater than the reference current $Ir_i$, is applied to the input terminal $INs_i$. The current $Is_i-Ir_i$ required for the correct balance of the currents at the junction A will flow through the transistor Mn3. The transistor Mn1 will therefore be turned off. Since the current passing through Mn1 is zero, the current In6 at the drain terminal of the transistor Mn6 will also be zero. The current flowing through the transistor Mn2 is equal to $Ir_i-(Is_i-Ir_i)=2\cdot Ir_i-Is_i$. This current is mirrored by the structure Mp5–Mp8, and therefore, there will be a current $Ip7=2\cdot Ir_i-Is_i$ at the drain terminal of the transistor Mp7. The current supplied by the output terminal $OUTs_i$ will therefore be $Is_{(i+1)}=Ip7-In6=2\cdot Ir_i-Is_i$.

The voltage at the junction A varies with the value of the actual current $Is_i$. More precisely, the voltage at the junction A will be higher when the actual current $Is_i$ is greater than the reference current $Ir_i$. This is a result of the voltage drop across the transistor Mn3 connected in a diode configuration, and will be lower when the actual current $Is_i$ is less than the reference current $Ir_i$. The comparator unit 415 generates at the output terminal $OUTd_i$ a binary value which changes as a function of the value of the voltage at the junction A. Similar considerations are applicable in a case in which use is made of a current comparator. The current comparator receives at its input, through suitable current mirrors, or other equivalent circuits, for example, the actual current $Is_i$ and the reference current $Ir_i$.

The non-linear circuit structure described above is particularly simple and compact. Moreover, the actual current for the next unit is obtained automatically without the necessity for a true comparison operation and a subsequent selection, and therefore, this circuit structure ensures a high overall operating speed. Similar considerations are applicable when the p-channel MOS transistors are replaced with n-channel MOS transistors, and vice versa, or when bipolar transistors, different non-linear circuit structures, and in general, other equivalent reading devices are used.

The equalizing switches SWeq1 and SWeq2 are used to further increase the operating speed of the unit $S_i$. In a time interval preceding the reading operation, for example, during the stage of pre-charging of the memory cells and of the reference cells in which the unit $S_i$ cannot be used because the selected memory cell and the reference cells are not capable of supplying the corresponding current correctly, the equalizing switch SWeq1 and SWeq2 are closed. In this situation, the equalizing switch SWeq1 brings the junctions A and B substantially to the same voltage, while the switch SWeq2 makes the voltages at the drain terminals of the transistors Mn1 and Mn2 substantially equal.

This causes an equalization of the unit $S_i$, with the circuit in an optimal condition for its operation, similar considerations are applicable in the case in which the comparator unit 415 is also equalized. Consequently, when the equalizing switches SWeq1 and SWeq2 are open at the end of the pre-charging stage so that they do not affect the operation of the circuit, particularly operation of the unit $S_i$, the generation of the actual current for the next unit $Is_{(i+1)}$ can be correctly executed in an extremely rapid way. This solution can be used to rapidly execute an operation of reading a memory cell as soon as it is required. For example, as soon as a preceding reading has ended or even while the preceding reading is still in progress.

The stand-by transistors Mpsb1, Mpsb2 and Mnsb are used to minimize the power consumption of the unit $S_i$ in the quiescent state, i.e., when operation of the reading device is not required. In this state, the control signal SB is at a high level, with the dual control signal −SB at a low level, so that the stand-by transistors Mpsb1, Mpsb2 and Mnsb are conducting. This ensures the substantial cancellation of the current flowing in the corresponding current mirror structures. To minimize the overall power consumption in the quiescent state, the reference currents $Ir_i$ generated by the unit 405 and the actual current $Is_1$ will be cancelled. The next actual currents will be zero due to the cancellation of the currents of the mirrors of the individual units.

Clearly, a person skilled in the art may make numerous modifications and changes to the method for reading a multiple-level memory cell described above to meet contingent and specific requirements, all these modifications and changes being included within the scope of protection of the invention as defined by the following claims.

What is claimed is:

1. A method for reading a multiple-level memory cell capable of taking on a plurality of states, each state being represented by a different value of a physical quantity and each state being associated with a corresponding logic value, the method comprising the steps of:

setting an actual physical quantity to a value correlated with a value of the physical quantity corresponding to the state of the memory cell; and repeating a cycle until a complete determination of the logic value corresponding to the state of the memory cell is determined, the cycle comprising the steps of setting a component of the logic value to a value which is a function of a range in which the actual physical quantity lies, determined by comparing the actual physical quantity with at least one reference physical quantity having a predetermined value lying between a minimum value and a maximum value for the actual physical quantity, and setting the actual physical quantity for a possible next cycle to a relative value of the actual physical quantity with respect to the range in which the actual physical quantity lies.

2. A method according to claim 1, wherein the step of setting the actual physical quantity comprises setting the actual physical quantity to be equal to the physical quantity corresponding to the state of the memory cell.

3. A method according to claim 1, wherein the memory cell can take on $m=2^n$ states and the cycle is repeated n number of times; and wherein the step of setting a component of the logic value further comprises setting one bit of the logic value to a value according to a result of a comparison between the actual physical quantity and a single reference physical quantity having a value lying between two median values among possible values of the actual physical quantity.

4. A method according to claim 1, wherein the step of setting the actual physical quantity further comprises setting the actual physical quantity for the next cycle equal to the actual physical quantity if the actual physical quantity is less than the reference physical quantity, and if the actual physical quantity is greater than the reference physical quantity, then setting the actual physical quantity to be equal to twice the reference physical quantity minus the actual physical quantity.

5. A method according to claim 4, wherein the actual physical quantity for the next cycle has the same value for actual physical quantities having a symmetrical value with respect to the reference physical quantity.

6. A method according to claim 1, further comprising the step of converting the logic value to a binary weighted value.

7. A method for reading a multiple-level memory cell capable of taking on a plurality of states, each state being represented by a different value of a physical quantity and each state being associated with a corresponding logic value, the method comprising the steps of:

setting an actual physical quantity to a value correlated with a value of the physical quantity corresponding to the state of the memory cell; and repeating a cycle until a complete determination of the logic value corresponding to the state of the memory cell is determined, the cycle comprising the steps of setting a component of the logic value to a value which is a function of a range in which the actual physical quantity lies, setting the actual physical quantity for a possible next cycle to a relative value of the actual physical quantity with respect to the range in which the actual physical quantity lies, and converting the logic value to a binary weighted value.

8. A method according to claim 7, wherein the step of setting a component of the logic value to a value which is a function of a range in which the actual physical quantity lies comprises comparing the actual physical quantity with at least one reference physical quantity having a predetermined value lying between a minimum value and a maximum value for the actual physical quantity.

9. A method according to claim 7, wherein the step of setting the actual physical quantity comprises setting fr the actual physical quantity to be equal to the physical quantity corresponding to the state of the memory cell.

10. A method according to claim 7, wherein the memory cell can take on $m=2^n$ states and the cycle is repeated n number of times; and wherein the step of setting a component of the logic value further comprises setting one bit of the logic value to a value according to a result of a comparison between the actual physical quantity and a single reference physical quantity having a value lying between two median values among possible values of the actual physical quantity.

11. A method according to claim 7, wherein the step of setting the actual physical quantity further comprises setting the actual physical quantity for the next cycle equal to the actual physical quantity if the actual physical quantity is less than the reference physical quantity, and if the actual physical quantity is greater than the reference physical quantity, then setting the actual physical quantity to be equal to twice the reference physical quantity minus the actual physical quantity.

12. A method according to claim 11, wherein the actual physical quantity for the next cycle has the same value for actual physical quantities having a symmetrical value with respect to the reference physical quantity.

13. A device for reading a multiple-level memory cell capable of taking on a plurality of states, each state being represented by a different value of a physical quantity and each state being associated with a corresponding logic value, the device comprising:

a reference circuit for generating a plurality of reference electrical quantities; and a sensing circuit for comparing a physical quantity corresponding to the state of the memory cell with the reference electrical quantities, said sensing circuit comprising a plurality of units cascade connected, each unit having an input receiving an actual physical quantity from a preceding unit except for a first unit having an input receiving an actual physical quantity correlated with the physical quantity corresponding to the state of the memory cell, and each unit having an input receiving at least one reference electrical quantity having a predetermined value lying between a minimum value and a maximum value of the actual physical quantity, each unit having an output providing a component of the logic value which is a function of a range within which the actual physical quantity lies, which is determined by comparing the actual physical quantity with at least one reference electrical quantity, and an actual physical quantity for a next unit equal to a relative value of the actual physical quantity with respect to the range within which it lies.

14. A device according to claim 13, wherein each unit comprises a non-linear circuit for automatically generating an actual physical quantity for said next unit.

15. A device according to claim 13, wherein said first unit receives the physical quantity corresponding to the state of the memory cell.

16. A device according to claim 13, wherein said memory cell can take on $m=2^n$ states and said sensing circuit comprises n units, each unit receiving a single reference physical quantity having a value lying between two median values between possible values of a corresponding actual physical quantity, and each unit producing a bit of the logic value having a value as a function of a result of a comparison between the actual physical quantity and the reference physical quantity.

17. A device according to claim 16, wherein each unit produces an actual physical quantity for the next unit equal to the actual physical quantity if the actual physical quantity is less than the reference physical quantity, and if the actual physical quantity is greater than the reference physical quantity, then the actual physical quantity is equal to twice the reference physical quantity minus the actual physical quantity.

18. A device according to claim 17, wherein each unit produces an actual physical quantity for the next unit having the same value for actual physical quantities having a symmetrical value with respect to the reference physical quantity.

19. A device according to claim 13, further comprising a converter circuit for converting the logic value to a binary weighted value.

20. A device according to claim 18, wherein the actual physical quantity and the reference physical quantity are current values, each unit having a first input terminal receiving the reference current, a second input terminal receiving the actual current, a first output terminal supplying the actual current for said next unit, and a second output terminal supplying a corresponding bit of the logic value, each unit further comprising:

a current generator circuit connected to the first input terminal and to a first junction and to a second junction to apply the reference current to the first and second junctions, the second input terminal being connected to the first junction;

a comparison circuit connected between the first junction and the second output terminal for generating the bit;

a unidirectional conducting circuit connected between the first junction and the second junction; and at least one first current mirror and a third current mirror connected between the first output terminal and the first junction and the second junction respectively.

21. A device according to claim 20, wherein said comparison circuit comprises a voltage comparator for generating the bit as a function of a voltage value at the first junction.

22. A device according to claim 20, wherein said at least one first current mirror comprises a first current mirror and a second current mirror with opposite polarity cascade connected together.

23. A device according to claim 22, wherein said first, second and third current mirrors have a cascade structure.

24. A device according to claim 22, further comprising a cancellation circuit for canceling current in said first, second and third current mirrors.

25. A device according to claim 20, further comprising a first transistor and a second transistor connected, respectively, between the first junction and the at least one first current mirror and between the second junction and the third current mirror.

26. A device according to claim 20, further comprising a first equalizing switch connected between the first junction and the second junction, said first equalizing switch being in an open state during an operation of reading of the memory cell and being in a closed state in a time interval preceding the reading operation.

27. A device according to claim 25, further comprising a second equalizing switch connected between a third junction common to said first transistor and to said at least one first current mirror and a fourth junction common to said second transistor and to the third current mirror, said second equalizing switch being in an open state during an operation of reading the memory cell and being in a closed state in a time interval preceding the reading operation.

28. A memory device comprising:

at least one multiple-level memory cell capable of taking on a plurality of states, each state being represented by a different value of a physical quantity and each state being associated with a corresponding logic value;

a selection circuit for selecting said at least on memory cell and providing at an output the physical quantity corresponding to a state of said selected memory cell; and at least one device for reading the memory cell, said at least one device comprising a reference circuit for generating a plurality of reference electrical quantities, and a sensing circuit for comparing the physical quantity corresponding to the state of the memory cell with the reference electrical quantities, said sensing circuit comprising a plurality of units cascade connected, each unit having an input receiving an actual physical quantity from a preceding unit except for a first unit having an input receiving an actual physical quantity correlated with the physical quantity corresponding to the state of the memory cell, and each unit having an input receiving at least one reference electrical quantity having a predetermined value lying between a minimum value and a maximum value of the actual physical quantity, each unit having an output providing a component of the logic value which is a function of a range within which the actual physical quantity lies, which is determined by comparing the actual physical quantity with at least one reference electrical quantity, and an actual physical quantity for a next unit equal to a relative value of the actual physical quantity with respect to the range within which it lies.

29. A memory device according to claim 28, wherein each of said at least one multiple-level memory cell comprises a floating-gate MOS transistor, each state of the memory cell being defined by a different threshold voltage of the floating-gate MOS transistor.

30. A memory device according to claim 28, wherein each unit comprises a non-linear circuit for automatically generating an actual physical quantity for said next unit.

31. A memory device according to claim 28, wherein said first unit receives the physical quantity corresponding to the state of the memory cell.

32. A memory device according to claim 28, wherein said memory cell can take on $m=2^n$ states and said sensing circuit comprises n units, each unit receiving a single reference physical quantity having a value lying between two median values between possible values of a corresponding actual physical quantity, and each unit producing a bit of the logic value having a value as a function of a result of a comparison between the actual physical quantity and the reference physical quantity.

33. A memory device according to claim 32, wherein each unit produces an actual physical quantity for the next unit equal to the actual physical quantity if the actual physical quantity is less than the reference physical quantity, and if the actual physical quantity is greater than the reference physical quantity, then the actual physical quantity is equal to twice the reference physical quantity minus the actual physical quantity.

34. A memory device according to claim 33, wherein each unit produces an actual physical quantity for the next unit having the same value for actual physical quantities having a symmetrical value with respect to the reference physical quantity.

35. A memory device according to claim 28, further comprising a converter circuit for converting the logic value to a binary weighted value.

36. A memory device according to claim 34, wherein the actual physical quantity and the reference physical quantity are current values, each unit having a first input terminal receiving the reference current, a second input terminal receiving the actual current, a first output terminal supplying the actual current for the next unit, and a second output terminal supplying a corresponding bit of the logic value, each unit further comprises:

a current generator circuit connected to the first input terminal and to a first junction and to a second junction to apply the reference current to the first and second junctions, the second input terminal being connected to the first junction;

a comparison circuit connected between the first junction and the second output terminal for generating the bit;

a unidirectional conducting circuit connected between the first junction and the second junction; and at least one first current mirror and a third current mirror connected between the first output terminal and the first junction and the second junction respectively.

37. A memory device according to claim 36, wherein said comparison circuit comprises a voltage comparator for generating the bit as a function of a voltage value at the first junction.

38. A memory device according to claim 36, wherein said at least one first current mirror comprises a first current mirror and a second current mirror with opposite polarity cascade connected together.

39. A memory device according to claim 36, wherein said first, second and third current mirrors have a cascade structure.

40. A memory device according to claim 36, further comprising a cancellation circuit for canceling current in said first, second and third current mirrors.

41. A memory device according to claim 36, further comprising a first transistor and a second transistor connected, respectively, between the first junction and said at least one first current mirror and between the second junction and said third current mirror.

42. A memory device according to claim 36, further comprising a first equalizing switch connected between the first junction and the second junction, said first equalizing switch being in an open state during an operation of reading of the memory cell and being in a closed state in a time interval preceding the reading operation.

43. A memory device according to claim 41, further comprising a second equalizing switch connected between a third junction common to said first transistor and to said at least one first current mirror and a fourth junction common to said second transistor and to the third current mirror, said second equalizing switch being in an open state during an operation of reading the memory cell and being in a closed state in a time interval preceding the reading operation.

* * * * *

UNITED STATES PATENT AND TRADEMARK OFFICE

CERTIFICATE OF CORRECTION

PATENT NO. : 6,084,797
DATED : July 4, 2000
INVENTOR(S) : Franco Maloberti, Andrea Oneto, Guido Torelli It is certified that error appears in the above-identified patent and that said Letters Patent is hereby corrected as shown below:

Foreign Application Priority Data:

Item [30], insert -- March 27, 1998 [EP] European Patent Office 98830188 --

Signed and Sealed this

Fourteenth Day of August, 2001

Attest:

Nicholas P. Godici

NICHOLAS P. GODICI

*Attesting Officer* *Acting Director of the United States Patent and Trademark Office*